United States Patent [19]

Sayers

[11] Patent Number: 4,855,744
[45] Date of Patent: Aug. 8, 1989

[54] ANGLE DIGITIZER

[75] Inventor: Anthony D. Sayers, Crawley, England

[73] Assignee: U.S. Philips Corporation, New York, N.Y.

[21] Appl. No.: 266,345

[22] Filed: Nov. 1, 1988

Related U.S. Application Data

[63] Continuation of Ser. No. 122,825, Nov. 19, 1987, abandoned.

[30] Foreign Application Priority Data

Dec. 23, 1986 [GB] United Kingdom ................ 8630815

[51] Int. Cl.[4] .............................................. H03M 1/64
[52] U.S. Cl. .................................... 341/116; 318/654; 318/655; 324/83 D
[58] Field of Search ................ 341/112, 116; 318/654, 318/655, 662, 692; 340/315–318, 870.34; 324/830

[56] References Cited

U.S. PATENT DOCUMENTS 4,390,865  6/1983  Lauro ................................. 341/116
4,598,289  7/1986  Marin et al. .
4,754,259  6/1988  Joseph et al. ................. 340/347 SY Primary Examiner—William M. Shoop, Jr.
Assistant Examiner—Marc S. Hoff
Attorney, Agent, or Firm—Brian J. Wieghaus

[57] ABSTRACT

A system for producing a digital representation of the value of an angle $\theta$, typically a phase angle, from two analog input quantities representative of A sin $\theta$ and A cos $\theta$, where A is an amplitude factor, comprises logarithmic amplifiers (IC1–IC4) which produce analog representations of a plurality of quantities (sin $\theta$, cos $\theta$, sin $(\theta+3\pi/4)$, cos $(\theta+3\pi/4)$) derived from the two input quantities and which are arranged to add or subtract their outputs to produce quantities ($V_1$–$V_4$) which are independent of A and the value of each of which lies within a predetermined range ($-C$ to $+C$) in at least one respective portion ($2\pi/n$) of an angular range for $\theta$ of $2\pi$ radians. The digital representation of $\theta$ is the concatenation of digital representations of the angular portion ($2\pi/n$) in which $\theta$ lies and of the value of $\theta$ within the portion that is derived from the selected appropriate one of the quantities $V_1$–$V_4$ with an analog to digital converter. Such a system enables high resolution to be obtained at a high operating speed. Suitably, the quantities $V_1$–$V_4$ vary linearly with $\theta$ in their respective angular portions and are [log tan] functions of $\theta$.

20 Claims, 4 Drawing Sheets

ANGLE DIGITIZER

This is a continuation of application Ser. No. 122,825, filed Nov. 19, 1987. Priority of application Ser. No. 8630815, filed on Dec. 23, 1986 in Great Britain, is claimed under 35 U.S.C. 119.

DESCRIPTION

BACKGROUND OF THE INVENTION

This invention relates to a system for producing a digital representation of the value of an angle $\theta$ from two first analogue quantities respectively representative of A sin $\theta$ and A cos $\theta$, where A is an amplitude factor, comprising first means for deriving from the two first analogue quantities a plurality of n second analogue quantities which are functions of $\theta$ such that in each of n contiguous portions of a total angular range for $\theta$ of $2\pi$ radians, each portion extending over $2\pi/n$ radians, the value of a respective third analogue quantity which is derivable from two of the second quantities and which is independent of A lies within a predetermined range of values, second means, comprising comparison means, for deriving from the second analogue quantities a first digital quantity representative of which one of the n portions the value of $\theta$ lies in, third means, comprising selection means controlled by said first digital quantity and analogue-to-digital conversion means, for deriving a second digital quantity representative of the value of the respective third analogue quantity whose value lies within said predetermined range of values and thereby being representative of the value of $\theta$ within said one portion, and fourth means for deriving from the first and second digital quantities a digital representation of $\theta$. The angle $\theta$ may for example be a phase angle.

U.S. Pat. No. 4,390,865 discloses such a system, being an apparatus for digital position measurements, for example for machine tools. In this apparatus, there are derived from quantities representing sin $\alpha$ and cos $\alpha$ four quantities respectively representing sin $\alpha$, $\overline{\sin \alpha}$, cos $\alpha$ and $\overline{\cos \alpha}$. Logic circuitry including comparators derives from these quantities a digital representation of which of eight octants of an angular range of $2\pi$ radians the value of the angle $\alpha$ lies in. This digital representation controls selectors which select two of the four quantities; a digital representation of the quotient of the two selected quantities is produced by an analogue to digital converter, the denominator of the quotient serving as a reference voltage in the converter. The two quantities are selected to satisfy the requirement that the value of their quotient lies between zero and $(1/\sqrt{2})$. The digital representation of the quotient is supplied to a ROM coupled to a micro-processor which also together receive the digital representation of the octant and therefrom derive a digital representation of $\alpha$.

Such an apparatus has the disadvantage of being unsuited for applications in which the amplitude factor A in the quantities representing the sin $\alpha$ and cos $\alpha$ may vary over a substantial range, since analogue-to-digital converters require a reference voltage (which in this instance is the denominator of the quotient) to lie within a small range to ensure satisfactory operation; the converters are furthermore not capable of very high speed operation when used to form a quotient in this manner, and the use of a microprocessor also restricts the speed of operation.

SUMMARY OF THE INVENTION

According to the invention, a system as set forth in the opening sentence of this specification is characterised in that the third means comprise amplifier means operable to produce a plurality of n fourth analogue quantities respectively substantially representative of the logarithms of the second analogue quantities over at least a range of values thereof. The third means further comprises addition and/or subtraction means for deriving from the fourth analogue quantities each of the third analogue quantities the value of each of which lies within said predetermined range of values in at least one respective portion of the angular range for $\theta$ of $2\pi$ radians. The third analogue quantities are representative of the logarithms, over at least a range of values thereof, of quotients of respective pairs of the second analogue quantities. Such a system may satisfactorily handle substantial variations in the amplitude factor A and may be capable of higher speed operation than the known apparatus referred to above. It may be particularly suited to applications in which high resolution (but not necessarily high absolute accuracy) is required, especially at high speeds.

The amplifier means may be such that the fourth analogue quantities are respectively substantially odd functions of the second analogue quantities. This simplifies the system in that it allows both negative and positive values of each of said plurality of n quantities to be used which in turn may simplify the selection process used in deriving the second digital quantity.

Suitably, the third analogue quantities vary substantially linearly with $\theta$ in their respective portion(s) of the angular range. This can simplify the system by obviating the need for means (such as a ROM) to determine the value of $\theta$ corresponding (with non-linear relationships between the third analogue quantities and $\theta$) to the value of the second digital quantity.

A suitably simple relationship between the third analogue quantities and $\theta$ are expressions of the form $\pm \log [\tan (\theta \pm m\pi/n)]$ where m is an integer.

The value of each of the third analogue quantities may lie within said predetermined range of values in two respective portions of the angular range for $\theta$ of $2\pi$ radians, said value varying with $\theta$ in opposite respective senses in the two portions. This simplifies the system by reducing the number of third analogue quantities that are required, compared with a system in which the value lies within the predetermined range in only a single respective portion of the $2\pi$ radians angular range.

BRIEF DESCRIPTION OF THE DRAWINGS

An embodiment of the invention will now be described, by way of example, with reference to the diagrammatic drawings, in which.

DETAILED DESCRIPTION OF THE PREFERRED EMBODIMENT

Figure 1:
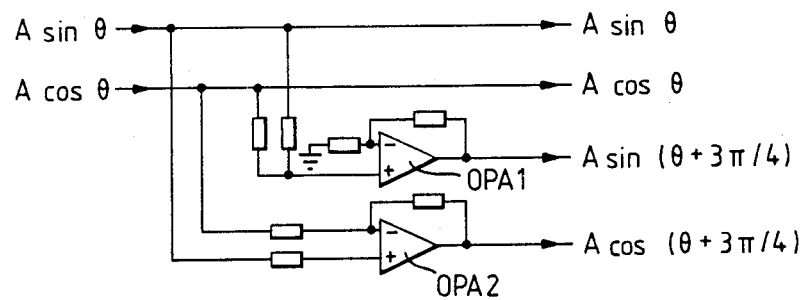
FIG. 1 shows an addition circuit for deriving four analogue quantities from quantities representing sin $\theta$ and cos $\theta$.

Referring to FIG. 1, the inputs to a system embodying the invention are two analogue quantities respectively representative of A sin $\theta$ and A cos $\theta$ where A is an amplitude factor which may vary over a substantial range. The quantities are supplied to two operational amplifiers OPA1, OPA2 which are arranged respectively to add and to subtract their input signals and each to scale their output signal to produce two analogue quantities representative of $-(A/\sqrt{2})$ (sin $\theta$+cos $\theta$) and $-(A/\sqrt{2})$ (sin $\theta$−cos $\theta$); these may be written as A sin ($\theta+3\pi/4$) and A cos ($\theta+3\pi/4$) respectively. The latter two quantities together with the two input quantities, A sin $\theta$ and A cos $\theta$, form a set of four input quantities for the circuit of FIG. 2. This circuit comprises four logarithmic amplifier integrated circuits IC1-IC4, to which the four quantities are supplied pairwise, and four amplifiers OPA3-POA6 respectively coupled to the outputs of IC1-IC4. The logarithmic amplifier circuits are such that with a positive input signal, the output signal is positive and (unless the signal is a very small one) a close approximation to the logarithm of the input signal. With a negative input signal (which has no true logarithm), the output signal is negative and (unless the signal is a very small one) has a magnitude which is a close approximation to the logarithm of the magnitude of the input signal. For very small signals, the transfer characteristic deviates from the logarithmic characteristic to pass substantially through zero, so that the output is substantially an odd function of the input. FIG. 3 depicts schematically with a solid line the actual transfer characteristic and with dashed lines the curves $$V_{out} = \log V_{in} \; (V_{in} > 0)$$

$$V_{out} = -\log |V_{in}| \; (V_{in} < 0)$$

near zero.

Figure 2:
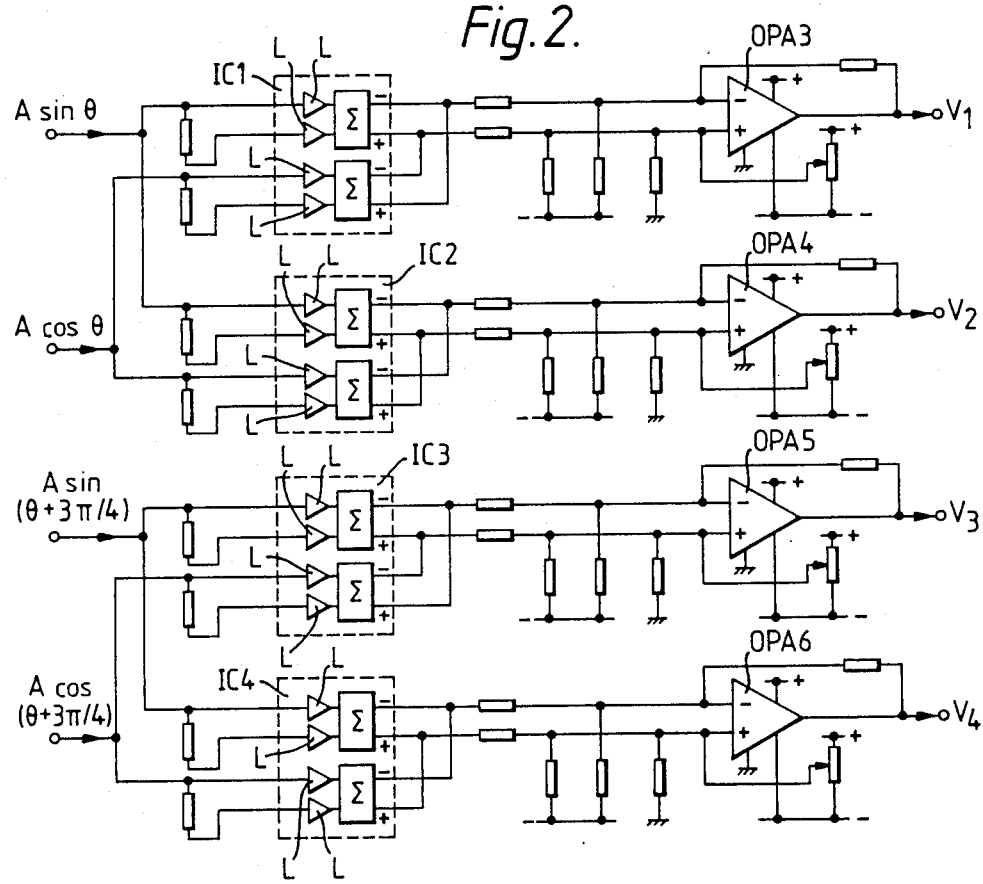
FIG. 2 shows logarithmic amplifier circuits for deriving four analogue quantities representing the logarithms of quotients of pairs of the quantities produced by the circuit of FIG. 1.
Figure 3:
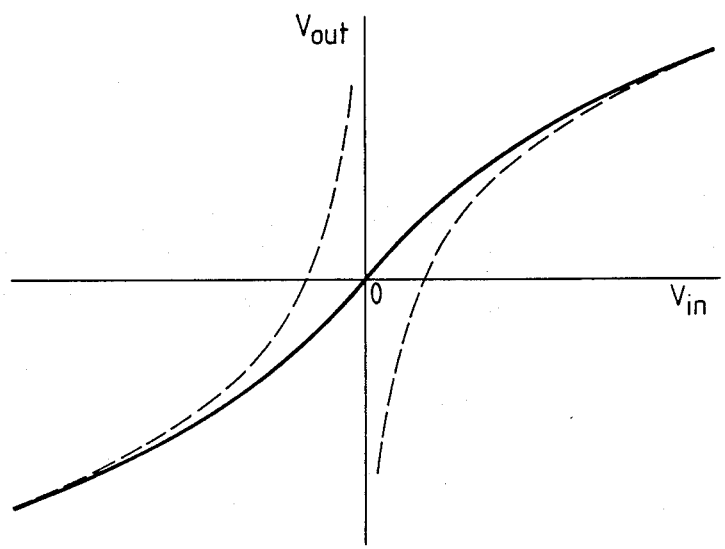
FIG. 3 depicts schematically a logarithmic amplifier characteristic.
Figure 4:
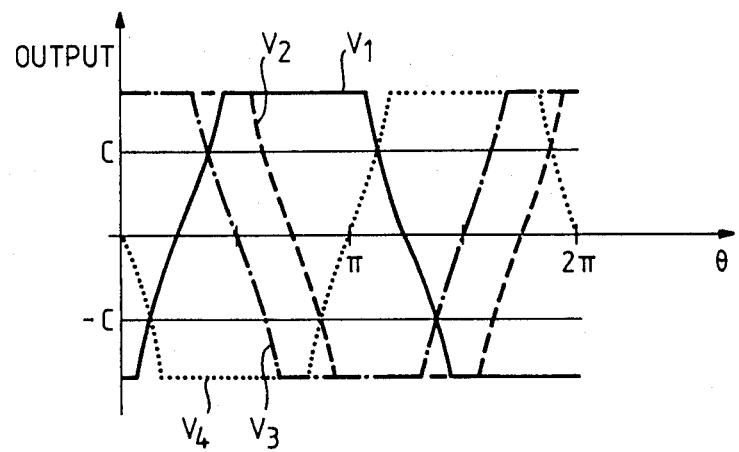
FIG. 4 is a graph of the four logarithmic quantities.

The circuit of FIG. 2 produces four output quantities $V_1$-$V_4$ which vary with $\theta$ in the manner shown in FIG. 4. Consider as an example $V_1$, which represents log tan $\theta$ when both sin $\theta$ and cos $\theta$ are positive and −log tan $\theta$, which may alternatively be written as log cot $\theta$, when both sin $\theta$ and cos $\theta$ are negative. When $\theta = 0$, $V_1$ is at a negative limiting value. As $\theta$ increases, a point is soon reached at which $V_1$ increases above this lower limit; $V_1$ passes through zero when $\theta = \pi/4$ and reaches a positive limiting value shortly before $\theta$ reaches $\pi/2$. $V_1$ remains at this upper limit until $\theta$ has exceeded $\pi$, when it decreases in an analoguous manner, passing through zero when $\theta = 5\pi/4$, to reach the lower limit before $\theta$ reaches $3\pi/2$; it then remains at the lower limit as $\theta$ increases to $2\pi$. The portions between $\pi/8$ and $3\pi/8$, and between $9\pi/8$ and $11\pi/8$, are substantially linear, the value of $V_1$ lying within a predetermined range of $-C$ to $+C$. the other quantities $V_2$-$V_4$ vary in an analogous manner, being simply shifted along the $\theta$ axis. They may be written as $$V_2(\theta) = V_1(\theta + \pi/2)$$

$$V_3(\theta) = V_1(\theta + 3\pi/4)$$

$$V_4(\theta) = V_1(\theta - 3\pi/4).$$

Thus, the total angular range for $\theta$ of $2\pi$ radians may be considered as divided into eight contiguous portions (i.e. octants), each of which extends over $\pi/4$ radians and in each of which one of the four quantities $V_1$-$V_4$ varies substantially linearly with $\theta$.

Figure 5:
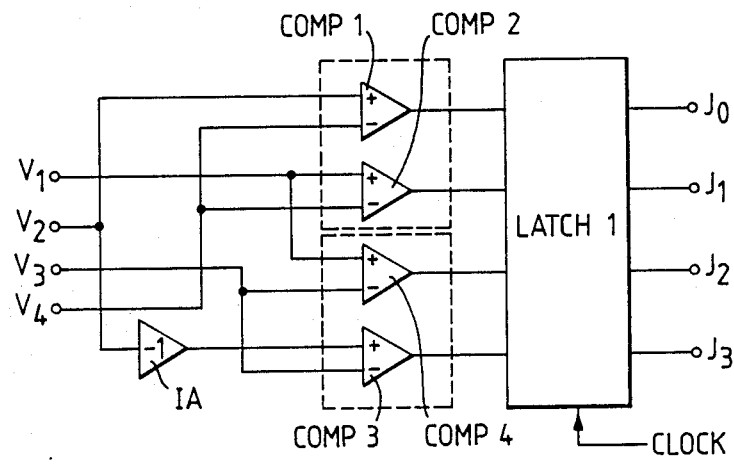
FIG. 5 shows a comparison circuit.

The four quantities $V_1$-$V_4$ are used to derive a first digital quantity representing which one of the eight octants the value of $\theta$ lies in. For this purpose, the quantities $V_1$-$V_4$ are supplied to the comparison circuit shown in FIG. 5. The circuit comprises four comparators, COMP1-COMP4, which in this case have ECL outputs for high speed operation and may be grouped in pairs in integrated circuits as denoted by dashed lines. The circuit further comprises an inverting amplifier IA for inverting $V_2$ to the positive input of comparator COMP4, and a four bit ECL latch LATCH1. The outputs of the comparators jointly constitute a four bit Johnson code representation of the value of $\theta$. This code is latched by LATCH1 which is clocked by a signal CLOCK, the output signals of the latch being designated $J_0$-$J_3$.

Figure 6:
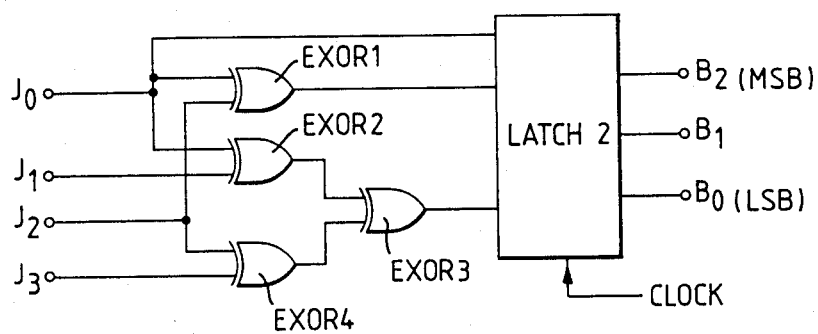
FIG. 6 shows a Johnson code to binary conversion circuit.

The four bit Johsnon code is then converted to a three bit binary code by the conversion circuit shown in FIG. 6. This circuit comprises four ECL Exclusive-OR gates, EXOR1-EXOR4, and a clocked three bit ECL latch LATCH2 whose output signals are designated $B_0$ (least significant bit)-$B_2$ (most significant bit). The purpose of the latches LATCH1 and LATCH2 is to ensure that no spurious codes are present at any time in the binary output code $B_0$-$B_2$.

Referring to FIG. 4, the zero of the binary code occurs in this case at $\theta = 5\pi/8$, resulting in a shift of the zero of the representation of $\theta$. Where (as is usually the case) the zero is arbitrary, this will be of no significance, particularly where high resolution within a range of only $2\pi$ radians is desired.

Figure 7:
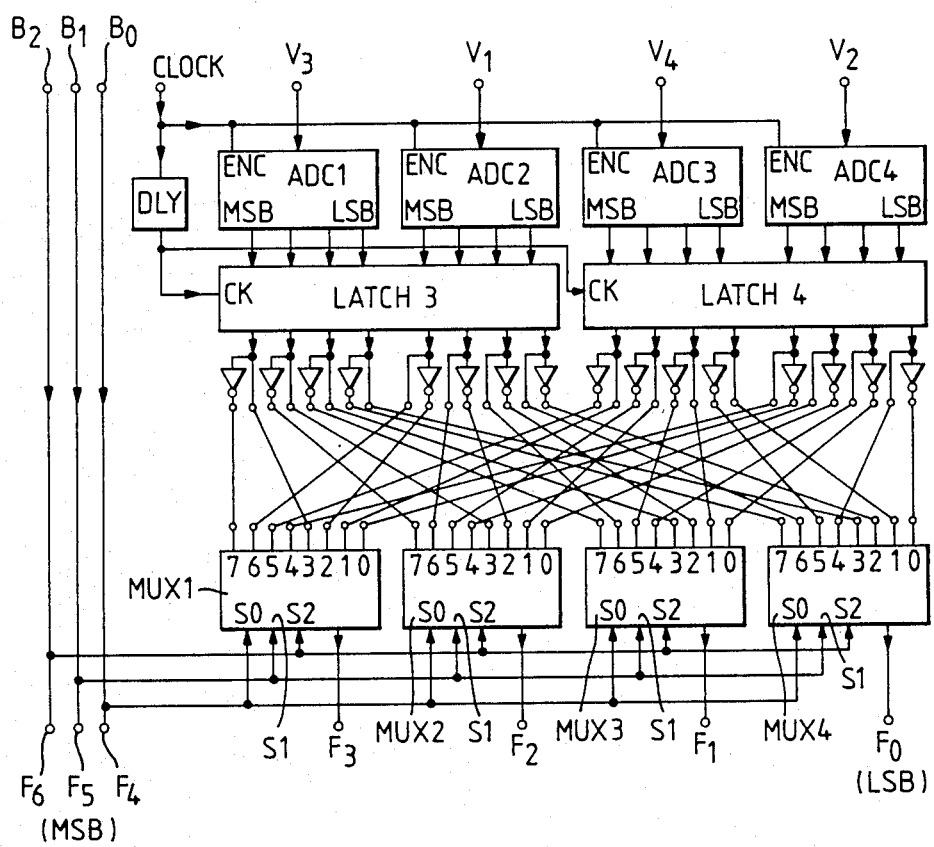
FIG. 7 shows an analogue-to-digital conversion and selection circuit.

The three bits of the binary code $B_0$-$B_2$ constitute the three most significant bits of the output of the whole system, and are also used to control the selection of the appropriate one of the four quantities $V_1$-$V_4$ in whose linearly sloping portion the value of 0 lies. This selection, and analogue-to-digital conversion, are performed by the circuit of FIG. 7. This circuit comprises four analogue-to-digital converters, ADC1-ADC4, to which the analogue quantities $V_3$, $V_1$, $V_4$ and $V_2$ are respectively supplied. The converters ADC1-ADC4 are connected pairwise at their outputs to two eight-bit ECL latches LATCH3, LATCH4. The signal CLOCK clocks the converters at their encode input ENC and clocks the latches (after a short delay introduced by a delay unit DLY so as to ensure a valid output) at their clock input Ck. Each of the outputs of the latches LATCH3 and LATCH4 is connected to a respective inverting amplifier so that both the inverted and non-inverted latch ouput signal is available. The resultant 32 outputs are connected to respective inputs designated 0-7 of four eight-way multiplexers MUX1-MUX4, each of which is controlled at selection inputs $S_0$-$S_2$ by the three-bit binary code $B_0$-$B_2$ so as to select the appropriate digital signal; a respective one of the set of four inverted or non-inverted outputs derived from one of the converters ADC1-ADC4 is selected by each of the four multiplexers, according to the octant in which the value of 0 lies. The output signals of the multiplexers respectively constitute the four least significant bits $F_0$–$F_3$, of the digital representation of $\theta$, representing the value of $\theta$ within the respective octant (in this case with respect to the lower limit of the octant). The four bits $F_0$–$F_3$ are concatenated with the three-bit binary code $B_0$–$B_2$ which constitutes the three most significant bits $F_4$–$F_6$, to form a seven-bit digital representation, $F_0$–$F_6$, $F_0$ being the least significant bit and $F_6$ the most significant bit.

As an example, consider a value of $\theta$ lying in the portion $5\pi/8$ to $7\pi/8$, for which the binary code $B_0$–$B_2$ is 000. In this portion, the quantity which varies substantially linearly with $\theta$ is $V_2$; the variation is negative-sloping. The binary code causes each of the multiplexers to select the signal at their respective input designated 0 which jointly receive the inverted signals that are derived from ADC4 and that represent $V_2$.

The outputs of the logarithmic amplifiers need not be odd functions of their inputs. In that case, said plurality of n analogue quantities may be such that each quantity is positive in the respective portion(s) of the range of $2\pi$ radians in which the logarithm of the quotient comprising that quantity lies within the predetermined range of values.

The logarithms of the quotients need not vary linearly with $\theta$ in the respective portion(s) of the range of $2\pi$ radians in which the value of the logarithm lies within said predetermined range of values. In that case, the system may comprise a ROM (for example addressed by the outputs of the multiplexers) to provide the value of $\theta$ corresponding to the digital value of the logarithm. This will delay the production of the digital representation of $\theta$ from the instant that the values of $A \sin \theta$ and $A \cos \theta$ are first supplied, but need not reduce the rate of operation of the system for the situation in which $\theta$ may vary rapidly.

The production of four quantities $V_1$–$V_4$ which are related to $\theta$ by log tan functions is considered a suitable number of such quantities. Producing, for example, only two quantities would result in quantities which would not vary linearly with $\theta$ in the respective portions of the angular range and which would hence necessitate means such as a ROM to provide the value of $\theta$ corresponding to the value of the digital representation of the quantity; as an alternative, producing eight quantities would result in the variations of the quantities with $\theta$ in the respective portions of the angular range being an even closer approximation to linear than with four quantities, but the system would be rather complex.

In a constructed embodiment of the form described with reference to the drawings, the logarithmic amplifiers were type TL441 (manufactured by Texas Instruments), the amplifiers OP3–OP6 were type NE5539, the pairs of comparators were type SP1650, the four-bit latch LATCH1 was half of a type SP9210, the analogue-to-digital converters were type AD9000 (of which only the four most significant bits were used), the eight-bit latches LATCH3 and LATCH4 were each type SP9210, and the multiplexers were type MC10164.

I claim:

1. A system for producing a digital representation of the value of an angle $\theta$ from two first analogue quantities respectively representative of $A \sin \theta$ and $A \cos \theta$, where A is an amplitude factor, comprising first means for deriving from the two first analogue quantities a plurality of n second analogue quantities which are functions of $\theta$ such that in each of n contiguous portions of a total angular range for $\theta$ of $2\pi$ radians, each portion extending over $2\pi/n$ radians, the value of a respective third analogue quantity which is derivable from two of the second quantities and which is independent of A lies within a predetermined range of values, second means, comprising comparison means, for deriving from the second analogue quantities a first digital quantity representative of which one of the n portions the value of $\theta$ lies in, third means for deriving a second digital quantity representative of the value of the respective third analogue quantity whose value lies within said predetermined range of values and thereby being representative of the value of $\theta$ within said one portion, said third means comprising selection means controlled by said first digital quantity and analogue-to-digital conversion means, and fourth means for deriving from the first and second digital quantities a digital representation of $\theta$, wherein the improvement comprises:

said third means comprising amplifier means operable to produce a plurality of n fourth analogue quantities respectively substantially representative of the logarithms of the second analogue quantities over at least a range of values thereof, and addition and/or subtraction means for deriving from the fourth analogue quantities each of the third analogue quantities the value of each of which lies within said predetermined range of values in at least one respective portion of the angular range for $\theta$ of $2\pi$ radians, the third analogue quantities being representative of the logarithms, over at least a range of values thereof, of quotients of respective pairs of the second analogue quantities.

2. A system as claimed in claim 1 wherein the amplifier means are such that the fourth analogue quantities are respectively substantially odd functions of the second analogue quantities.

3. A system as claimed in claim 1 wherein the third analogue quantities vary substantially linearly with $\theta$ in their respective portion(s) of the angular range.

4. A system as claimed in claim 1 wherein the third analogue quantities are related to $\theta$ by expressions of the form $\pm \log [\tan (\theta \times m\pi/n)]$ where m is an integer.

5. A system as claimed in claim 1 wherein the value of each of the third analogue quantities lies within said predetermined range of values in two respective portions of the angular range for $\theta$ of $2\pi$ radians, said value varying with $\theta$ in opposite respective senses in the two portions.

6. A system as claimed in claim 2 wherein the third analogue quantities vary substantially linearly with $\theta$ in their respective portion(s) of the angular range.

7. A system as claimed in claim 2 wherein the third analogue quantities are related to $\theta$ by expressions of the form $\pm \log [\tan (\theta \pm m\pi/n)]$ where m is an integer.

8. A system as claimed in claim 3 wherein the third analogue quantities are related to $\theta$ by expressions of the form $\pm \log [\tan (\theta \pm m\pi/n)]$ where m is an integer.

9. A system as claimed in claim 2 wherein the value of each of the third analogue quantities lies within said predetermined range of values in two respective portions of the angular range for $\theta$ of $2\pi$ radians, said value varying with $\theta$ in opposite respective senses in the two portions.

10. A system as claimed in claim 3 wherein the value of each of the third analogue quantities lies within said predetermined range of values in two respective portions of the angular range for $\theta$ of $2\pi$ radians, said value varying with $\theta$ in opposite respective senses in the two portions.

11. A system as claimed in claim 4 wherein the value of each of the third analogue quantities lies within said predetermined range of values in two respective portions of the angular range for $\theta$ of $2\pi$ radians, said value varying with $\theta$ in opposite respective senses in the two portions.

12. A system for producing a digital representation of the value of an angle $\theta$ from two first analogue quantities respectively representative of $A \sin \theta$ and $A \cos \theta$, where A is an amplitude factor, comprising:

means for deriving from the two first analogue quantities a plurality of n second analogue quantities which are functions of $\theta$ such that in each of n contiguous portions of a total angular range for $\theta$ of $2\pi$ radians, each contiguous portion extending over $2\pi/n$ radians, the value of a respective third analogue quantity lies within a predetermined range of values, said third analogue quantity being derivable from two of the second analogue quantities and being independent of A;

first deriving means for deriving from the third analogue quantities a first digital quantity representative of which one of the n portions the value of $\theta$ lies in;

amplifier means operable to produce a plurality of n fourth analogue quantities substantially representative of the logarithms of the second analogue quantities over at least a range of values thereof;

means for deriving from the fourth analogue quantities each of the third analogue quantities the value of each of which lies within said predetermined range of values in at least one respective portion of the angular range for $\theta$ of $2\pi$ radians, said fourth analogue quantities being representative of the logarithms, over at least a range of values thereof, of a quotient of respective pairs of second analogue quantities;

second deriving means for deriving a second digital quantity representative of the value of $\theta$ within said one portion, said second deriving means comprising selection means controllable by said first digital quantity for selecting the third analogue quantity in which the value of $\theta$ lies, and analogue-to-digital conversion means for producing a digital representation of each of said third analog quantities; and third deriving means for deriving a digital representation of $\theta$ from said first and second digital quantities.

13. A system as claimed in claim 12, wherein the amplifier means are such that the fourth analogue quantities are respectively substantially odd functions of the second analogue quantities.

14. A system as claimed in claim 13, wherein the third analogue quantities vary substantially linearly with $\theta$ in their respective portion(s) of the angular range.

15. A system as claimed in claim 14, wherein the third analogue quantities are related to $\theta$ by expressions of the form $\pm \log [\tan (\theta \pm m\pi/n)]$ where m is an integer.

16. A system as claimed in claim 13, wherein the third analogue quantities are related to $\theta$ by expressions of the form $\pm \log [\tan (\theta \pm m\pi/n)]$ where m is an integer.

17. A system as claimed in claim 12, wherein the third analogue quantities are related to $\theta$ by expressions of the form $\pm \log [\tan (\theta \pm m\pi/n)]$ where m is an integer.

18. A system as claimed in claim 15, wherein the value of each of the third analogue quantities lies within said predetermined range of values in two respective portions of the angular range for $\theta$ of $2\pi$ radians, said value varying with $\theta$ in opposite respective senses in the two portions.

19. A system as claimed in claim 16, wherein the value of each of the third analogue quantities lies within said predetermined range of values in two respective portions of the angular range for $\theta$ of $2\pi$ radians, said value varying with $\theta$ in opposite respective senses in the two portions.

20. A system as claimed in claim 12, wherein the value of each of the third analogue quantities lies within said predetermined range of values in two respective portions of the angular range for $\theta$ of $2\pi$ radians, said value varying with $\theta$ in opposite respective senses in the two portions.

* * * * *